United States Patent [19]
Gaicki et al.

[11] 3,996,659
[45] Dec. 14, 1976

[54] BONDING METHOD FOR SEMICONDUCTOR DEVICE MANUFACTURE

[75] Inventors: Stanley Gaicki, Tempe; Albert Louis Summers, Phoenix, both of Ariz.

[73] Assignee: Motorola, Inc., Chicago, Ill.

[22] Filed: Feb. 10, 1976

[21] Appl. No.: 656,910

[52] U.S. Cl. .................................. 29/590; 29/588; 357/80
[51] Int. Cl.[2] ......................................... B01J 17/00
[58] Field of Search ................... 29/588, 589, 590; 357/80

[56] References Cited
UNITED STATES PATENTS

| | | | |
|---|---|---|---|
| 3,089,067 | 5/1963 | Baird | 29/588 |
| 3,153,275 | 10/1964 | Ackerman | 29/588 |
| 3,259,814 | 7/1966 | Green | 29/588 |
| 3,828,425 | 8/1974 | Manus | 29/590 |

*Primary Examiner*—W. Tupman
*Attorney, Agent, or Firm*—Robert A. Farley; Harry M. Weiss

[57] ABSTRACT

An improved method of semiconductor device manufacture is provided in which the surfaces of glass sealed feed-through terminals are mechanically abraded to a uniform matte finish prior to plating and subsequent assembly. The mechanical abrasion, which in the preferred embodiment is performed by dry sand blasting, reduces the cost and improves the yield in subsequent assembly bonding steps and in particular substantially eliminates cold forming defects on the terminal nail head surface such that electrical conductors can be ultrasonically bonded thereto.

5 Claims, 4 Drawing Figures

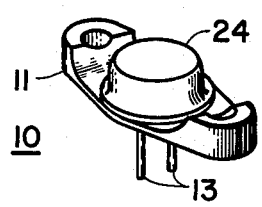
FIG. 1
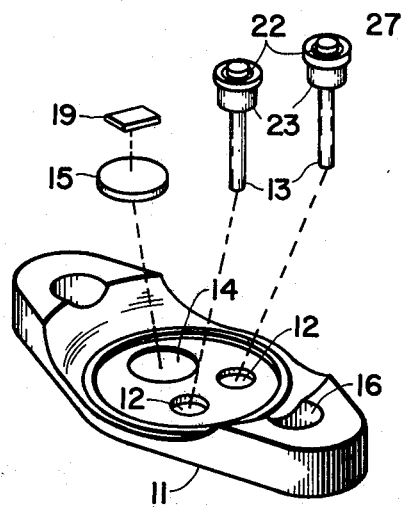
FIG. 2
FIG. 3
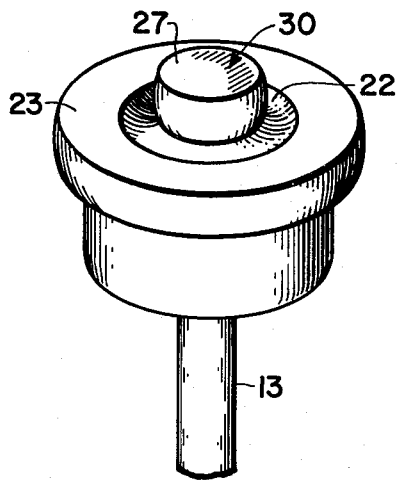
FIG. 4
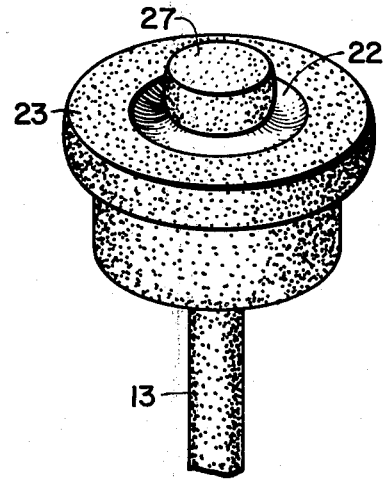

3,996,659

BONDING METHOD FOR SEMICONDUCTOR DEVICE MANUFACTURE

BACKGROUND

This invention relates to an improved method of semiconductor device manufacture and more particularly to a method of treating the surfaces of glass sealed feed-through terminals to provide for improved bonding in the subsequent assembly of a semiconductor device.

Semiconductor devices employed in high current or high voltage applications, commonly referred to as power devices, generate a substantial amount of heat in the operation of the device. In order to rapidly dissipate this heat and thereby allow the semiconductor unit to operate at rated power without damage, it is customary to employ a heat conductive member of substantial mass as a heat sink to transfer heat from the semiconductor unit during operation of the device. This heat sink may also function as a mounting base or support for the other elements of the device; for example, the die, cap, terminals, etc. Thus a common power device configuration utilizes a one piece mounting base of substantial thickness which provides a high rate of heat dissipation and easy mounting on electrical equipment. The mounting base may be provided with a raised portion or pedestal which serves as a holder for a semiconductor die or chip and at the same time serves with the remainder of the one piece base as one of the electrodes or terminals of the semiconductor device. Since the other terminals of the semiconductor device must be electrically insulated from this base, they are commonly inserted or "fed through" holes in this base using a glass collar which provides for electrical insulation and simultaneously forms a hermetic seal.

In completing the assembly of the semiconductor device, a critical and expensive operation is the forming of an electrical connection from the semiconductor diode chip to the glass sealed feed-through terminal. This electrical connection is generally formed by bonding a wire from the surface of the semiconductor die to the feed through terminal. Various bonding methods including thermal compression bonding and ultrasonic bonding are employed to form the connection which must be mechanically strong and which must have high electrical conductivity. Because the semiconductor chip or die is relatively fragile, the bonding energy used to form the bonds to its surface must be carefully controlled to avoid damage to the semiconductor surface or the underlying junctions. In the past, one method which has been employed is to first form an ultrasonic bond to the semiconductor die and then in a second operation to form a connection to the feed through terminal using tweezer welding. The method achieves good mechanical and electrical connections since each separate attachment operation is adapted to its particular attachment point but it is costly because it requires two separate operations performed on two different bonding machines. In studying possible improved methods of manufacturing, the cost advantages of a single step bonding operation have been recognized but the implementation of this type operation has proved difficult because the limited bonding energies required to avoid damage to the semiconductor unit are too low to form good mechanical and electrical bonds to the feed-through terminal.

SUMMARY OF THE INVENTION

Accordingly, it is an object of this invention to provide an improved method of semiconductor manufacture devices in which electrical connections to a semiconductor die and to a corresponding feed through terminal can be formed in a single step using low energy bonding.

It is a further object of this invention to provide an improved method of manufacturing semiconductor devices in which the surfaces of feed-through terminals have been adapted for the formation of low energy bonds such as ultrasonic bonds.

Briefly described, the invention is an improved method of semiconductor device manufacture in which the surfaces of a glass sealed feed through terminal are mechanically abraded to a uniform matte finish prior to plating to facilitate subsequent assembly bonding steps and in particular to enable the formation of electrical connections between the surface of semiconductor die and the feed through terminal using a single step low energy bonding process such as ultrasonic bonding.

BRIEF DESCRIPTION OF THE DRAWINGS

FIG. 1 is an assembled semiconductor device of the type manufactured using the method of the present invention.

FIG. 2 is an exploded view in perspective of the semiconductor device of FIG. 1 with the cover removed.

FIG. 3 is an enlarged view of the nailhead and of a glass sealed feed-through terminal showing work defects on the surface.

FIG. 4 shows the terminal of FIG. 3 after mechanical abrasion according to the method of the present invention

DETAILED DESCRIPTION

FIG. 1 shows one particular embodiment of a completed semiconductor device 10 manufactured according to the method of the present invention comprising a heat sink mounting base 11, device terminals 13 and an overlying cap or cover 24. FIG. 2 shows an exploded perspective view of device 10 with cover 24 removed. Mounting base 11 has openings 12 therethrough for terminals 13, and also has a cavity 14 to accommodate an insert or pedestal 15. Adjacent to the ends of base 11 are opening 16 for suitable mounting bolts or the like (not shown), to mount the device. The insert 15 is a size such that when it is positioned in cavity 14, its upper surface extends above the base 11 so that the semiconductor die 19 will be located at a proper height above the surface of mounting base 11 after mounting to the surface of pedestal 15. Terminals 13 are maintained in proper position within openings 12 by means of insulating sleeves 22 which are surrounded by flange collars or eyelets 23. The cap 24 (not shown) is sealed to the base with a flange of the cap engaging a raised angular surface 26 of mounting base 11. The ends of terminal 13 are shaped or formed to have an enlarged upper surface 27, sometimes called a nailhead. In one method of manufacture in which the insulating sleeve 22 is glass, terminal 13, insulating sleeve 22 and eylet 23 are assembled together, joined in a glass sealing furnace, etched to remove surface contamination, and plated with a suitable material such as nickel. In this assembly, the upper surface of the nailhead is positioned relative to eyelet 23 such that when eyelet 23 is inserted and bonded in hole 12 (typically by soldering in a furnace), surface 27 is positioned approximately 15 to 20 mils above the upper surface of semiconductor die 19. This positioning facilitates the bonding of an electrical conductor to the upper surface of semiconductor die 19 and to surface 27 of the nailhead.

FIG. 3 shows an enlarged perspective view of the upper surface 27 of terminal 13 and the associated eyelet 23 and glass seal insulating sleeve 22 as they appear after the preassembly sealing and plating steps described above. FIG. 3 shows a typical defect 30 as it would appear on the surface 27 of the nailhead. This defect is inherent in the cold forming operation used to form the nailhead and is of sufficient size and roughness to make low energy bonding such as ultrasonic bonding to surface 27 extremely difficult, even after surface 27 has been plated. It is to be noted that there are many possible kinds of defects which can result from the preassembly of a glass sealed feed-through terminal and that these defects are typified but not limited to defect 30 shown in FIG. 3. Since the nailhead surface is small (approximately 50 mils in diameter in the preferred embodiment) standard machining or smoothing procedures to remove forming defects from surface 27 on a one-at-a-time basis would be highly time consuming and costly. The method of the present invention provides a simple and low cost method for the elimination of cold forming defects 30 from surface 27 of the nailhead. The heart of the method resides in the discovery that batch process mechanical abrasion techniques such as dry sand blasting, vapor honing or barrel tumbling prior to the plating step results in a nailhead surface which is compatible with low energy bonding such as ultrasonic bonding. In one version of the invention, four to five thousand glass sealed feed-through terminals 13 are placed in a stainless steel fine wire mesh basket approximately 12 inches in diameter and are dry blasted with glass beads of 240 grit equivalent size. The blasting operation is performed at an air prssure of 75-80 pounds per square inch with the blasting nozzle positioned from 5-10 inches away from the terminals. The blasting time is varied to suit the severity of cold forming defects and times ranging from 3 minutes to 15 minutes are used to produce nailhead surfaces which are uniform and free of cold work defects. Any conventional commercial sandblasting or dry honing equipment is suitable for this operation. In another embodiment of the invention, vapor honing is used. Vapor honing refers to a wet blasting procedure which is similar to the procedure described except that the glass beads are combined with an inert liquid to form a blasting slurry. In still another embodiment of the invention, barrel tumbling using wet or dry glass beads is used. In this mode of the invention, process times are considerably longer and it has been determined that tumbling for approximately 12 hours is required to produce the same degree of surface finish as is produced by dry blasting for approximately 5 minutes.

After completion of the mechanical abrasion method of the present invention using one of the procedures described above, the preassembled glass sealed feed through terminal is plated using the conventional method as described above and is then ready for the subsequent assembly steps used in forming the completed semiconductor device.

FIG. 4 shows an enlarged perspective view of the terminal of FIG. 3 illustrating the improved condition of surface 27 as it appears after the mechanical abrasion procedures of the present invention. The uniform matte finish present over the surface 27 allows the formation of low energy bonds such as ultrasonic bonds which have high mechanical strength and electrical conductivity. An analysis of production lots shows that the method of the present invention results in a 3 to 4% improvement in ultrasonic wire bond yield and significant improvement in nickel plating quality. Since the mechanical abrasion procedures described above are batch processes affecting all other surfaces of terminal 13 and eyelet 23 in addition to upper surface 27, all of these surfaces have the defect free uniform matte finish previously described. This proves to be an additional benefit since the uniform finish has been found to enhance the other bonding and joining procedures of semiconductor device assembly such as the furnace soldering of eyelet 23 into hole 12.

We claim:
1. A method for manufacturing a semiconductor device characterized by the steps of:
   a. joining a terminal with a glass preform in an eyelet in a sealing furnace to form a glass sealed feed-through terminal;
   b. etching said terminal to remove surface contamination;
   c. mechanically abrading the surface of said terminal to provide a matte finish of uniform regularity;
   d. plating the surface of said terminal;
   e. joining a plurality of said terminals, a die mount pedestal and a semiconductor die to a mounting base to form a semiconductor device subassembly; and
   f. forming an electrical innerconnection by ultrasonically bonding a conductor to said semiconductor die and to said terminal.

2. The method recited in claim 1 wherein said mechanical abrasion step comprises sand blasting.

3. The method recited in claim 1 wherein said mechanical abrasion step comprises vapor honing.

4. The method as recited in claim 1 wherein said mechanical abrasion step comprises barrel tumbling.

5. The method recited in claim 2 wherein said sand blasting step comprises placing a plurality of said glass sealed feed-through terminals in an appropriate container and dry blasting for from 3-15 minutes from a distance of 5-10 inches away from said terminals at an air pressure of from 50-100 pounds per square inch.

* * * * *